United States Patent [19]

Hayafuji et al.

[11] Patent Number: 4,564,403
[45] Date of Patent: Jan. 14, 1986

[54] SINGLE-CRYSTAL SEMICONDUCTOR DEVICES AND METHOD FOR MAKING THEM

[75] Inventors: Yoshinari Hayafuji; Akashi Sawada; Setsuo Usui; Akikazu Shibata, all of Yokohama, Japan

[73] Assignee: Sony Corporation Research Center, Yokohama, Japan

[21] Appl. No.: 574,571

[22] Filed: Jan. 27, 1984

[51] Int. Cl.[4] .......................................... H01L 21/208
[52] U.S. Cl. ..................................... 148/171; 148/1.5; 148/172; 156/624; 427/33; 427/43.1; 427/86; 427/376.1; 428/620
[58] Field of Search .................. 148/1.5, 33, 171, 172; 427/33, 86, 43.1, 376.1; 428/620; 75/65 ZM; 156/624

[56] References Cited

U.S. PATENT DOCUMENTS

| 4,187,126 | 2/1980 | Radd et al. ............................ 148/1.5 |
| 4,305,973 | 12/1981 | Yaron et al. .................... 427/53.1 X |
| 4,309,225 | 1/1982 | Fan et al. ......................... 427/53.1 X |
| 4,323,417 | 4/1982 | Lam ..................................... 156/613 |
| 4,371,421 | 2/1983 | Fan et al. ............................ 156/624 |
| 4,382,186 | 5/1983 | Denholm et al. ................. 250/492.2 |
| 4,395,433 | 7/1983 | Nagakubo et al. ............. 148/175 X |
| 4,414,242 | 11/1983 | Nishimura et al. ................ 427/53.1 |
| 4,446,373 | 5/1984 | Denholm et al. ................. 250/492.2 |
| 4,448,632 | 5/1984 | Akasaka ......................... 427/53.1 X |
| 4,473,433 | 9/1984 | Bosch et al. ...................... 148/1.5 X |
| 4,479,847 | 10/1984 | McCaldin et al. ................... 156/624 |

FOREIGN PATENT DOCUMENTS 1029663 5/1966 United Kingdom .
1037909 8/1966 United Kingdom .
2142346 1/1985 United Kingdom .

Primary Examiner—George T. Ozaki
Attorney, Agent, or Firm—Lewis H. Eslinger; Alvin Sinderbrand

[57] ABSTRACT

A large, single-crystal semiconductor device is made from a substrate having a layer of polycrystalline or amorphous material thereon by exposing a region of the layer to a beam of electrons to melt the region and then solidifying the molten region from one end to the other in a first direction and outwardly toward the edges in a second direction normal to the first direction to form a single-crystal seed in the region. An operating layer of polycrystalline or amorphous material on the substrate in contact with the seed is scanned with a beam of electrons having a strip-like configuration. The beam remelts a portion of the seed and creates a molten zone in the layer that recrystallizes as a single crystal by lateral epitaxial recrystallization from the seed.

8 Claims, 44 Drawing Figures

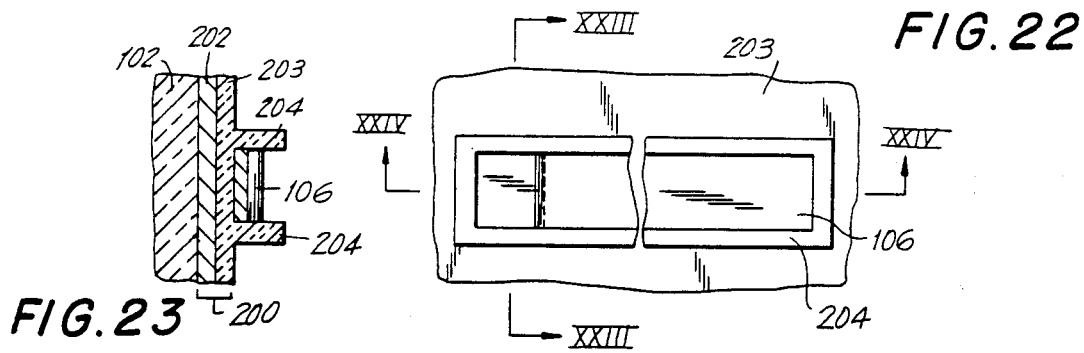
FIG. 22
FIG. 23
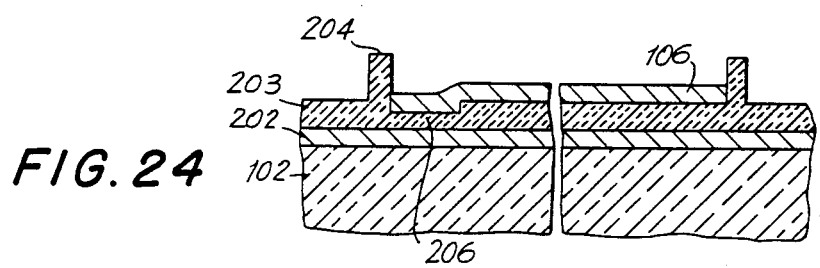
FIG. 24
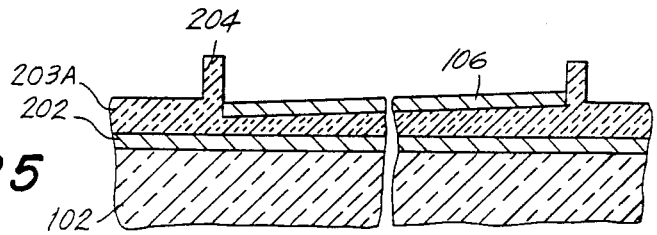
FIG. 25
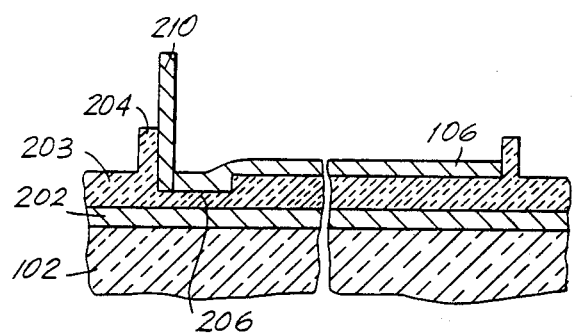
FIG. 26

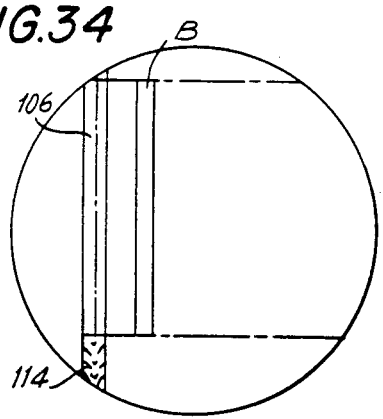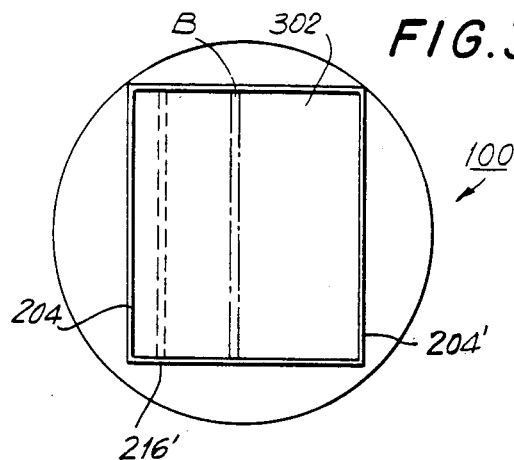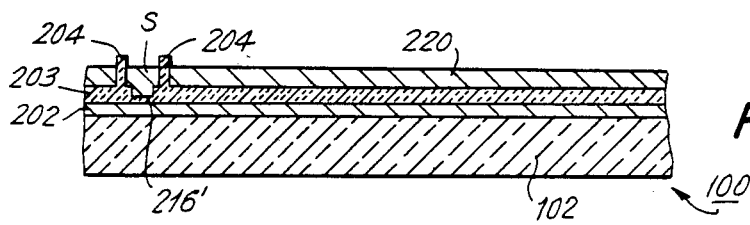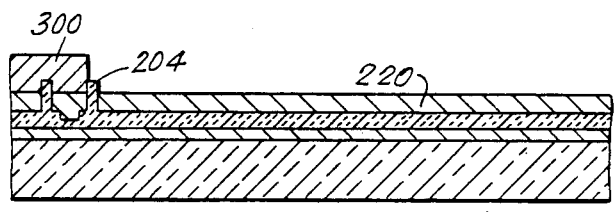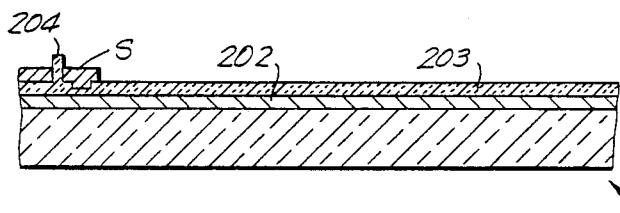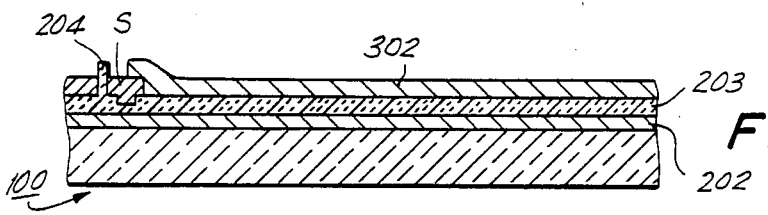

SINGLE-CRYSTAL SEMICONDUCTOR DEVICES AND METHOD FOR MAKING THEM

BACKGROUND OF THE INVENTION

1. Field of the Invention

The present invention relates to semiconductor devices and, more particularly, to large, single-crystal semiconductor devices and methods for making such devices.

2. Description of the Prior Art

The use of a high-energy beam for growing a large single crystal from a layer of polycrystalline material on a substrate has been proposed. As the beam scans the substrate it melts the layer and, ideally, when the molten zone cools it solidifies into a single crystal.

One of the conditions required to convert the polycrystalline layer into a single crystal is the provision of a "seed"; that is, a single crystal which is in contact with the molten zone to cause it to solidify as a single crystal. There has not yet been proposed any completely satisfactory means of producing such a seed.

Various conventional energy sources, such as spot laser beam, spot electron beam, graphite strip heater and arc strip lamp, have been proposed for use in melting the polycrystalline layer to induce liquid or solid phase regrowth by epitaxial recrystallization.

However, such conventional energy sources are unsatisfactory. For example, spot beam energy sources produce a resulting recrystallized layer lacking a uniform single-crystalline structure. Conventional strip beam energy sources, such as graphite strip heaters and arc strip lamps, can damage the underlying substrate because they require a relatively long time of contact of the beam with the polycrystalline layer, which results in dissipation of an unacceptable amount of heat from the layer into the underlying substrate.

Such energy sources are also unsuitable for producing a single seed crystal. A spot laser or electron beam, impinging momentarily on a polycrystalline layer, will create a relatively small, circular molten region in the layer. However, when the region solidifies, its boundary with the rest of the layer contains small silicon crystals, which of course make the region unsuitable for use as a seed. Scanning the layer with a spot beam has also not provided a suitable seed. And the conventional strip energy sources are unsatisfactory for the same reason that they cannot be used for growing a single-crystal layer.

SUMMARY OF THE INVENTION

It is an object of the present invention to provide a single-crystal semiconductor device that overcomes the shortcomings of the prior art.

It is another object of the present invention to provide a method of making a single-crystal semiconductor device using a seed crystal formed in a polycrystalline or amorphous layer on a substrate and then melting a polycrystalline or amorphous layer in contact with the seed to cause epitaxial recrystallization of the layer.

In accordance with an aspect of the present invention a method is provided of making a large, single-crystal semiconductor device comprising the steps of providing a wafer including a substrate having thereon a seed layer of polycrystalline or amorphous material, exposing a region of the layer to a beam of electrons to melt the region, cooling the molten region so that solidification thereof proceeds along a first direction and outwardly toward the edges of the region in a second direction substantially normal to the first direction for forming a single-crystal seed in the region, and scanning the layer with a beam of electrons having a strip-like configuration to remelt a portion of the seed and to create a molten zone in the layer that recrystallizes as a single crystal to lateral epitaxial recrystallization from the seed.

Those and other objects, features and advantages of the present invention will become apparent when the following detailed description of preferred embodiments of the invention is considered with the drawings.

BRIEF DESCRIPTION OF THE DRAWINGS

FIGS. 22–28 illustrate wafer constructions for providing the temperature-time relationship shown in FIG. 7.

FIGS. 34–38 illustrate a method of making a single-crystal semiconductor layer using the seed formed on the wafer shown in FIG. 30.

FIG. 39 illustrates a wafer construction for making a single-crystal semiconductor layer.

DETAILED DESCRIPTION OF PREFERRED EMBODIMENTS

Figure 1:
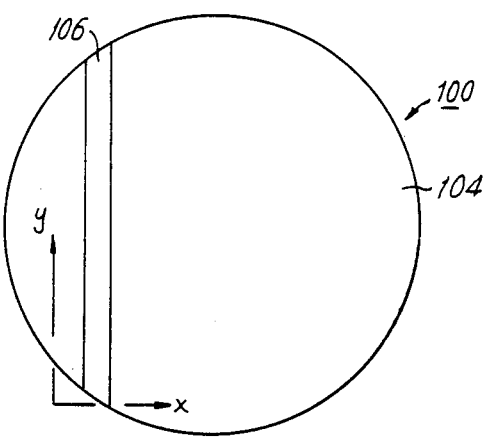
FIG. 1 is a top view of a wafer schematically illustrating in principle the provision of a region in which a seed crystal is formed in a polycrystalline or amorphous layer on a substrate.
Figure 2:
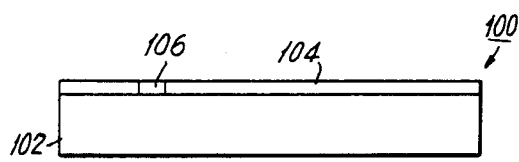
FIG. 2 is a side elevation view of the wafer shown in FIG. 1.

FIGS. 1 and 2 show a wafer 100 from the top and in elevation, respectively. The wafer 100 comprises a circular substrate 102 about 3 inches in diameter having a layer 104 of polycrystalline or amorphous material on it about 0.5 to 1.0 microns thick. By "polycrystalline" is meant a material comprising a large number of relatively small crystals. A typical example is polysilicon, which will be used herein to describe the present invention. However, by using polysilicon to describe the features of the present invention it is not intended to limit the kinds of materials suitable for use as the polycrystalline or amorphous layer 104.

The layer 104 of polysilicon is deposited on the substrate 102 by a method such as chemical vapour deposition ("CVD"). In the present invention, the substrate 102 can be any almost any material that presents a smooth surface, a feature which forms one of the advantages of the present invention, as will be appreciated from this description. Examples of materials suitable as a base for the substrate 102 are glass, quartz, sapphire and a crystalline semiconductor materials such as silicon, germanium or gallium arsenide. The base can also be a single-crystal semiconductor material with semiconductor-device regions formed therein. The use of such a base is particularly advantageous because the present invention will enable a three-dimensional device to be constructed on the base. In any case, the polysilicon layer 104 is to be deposited on an underlying insulating layer, so that if the base of the substrate 102 is not an insulating material, then a layer (not shown in FIG. 1) of an insulating material such as $SiO_2$ or silicon nitride is used underneath the layer 104.

Figure 3:
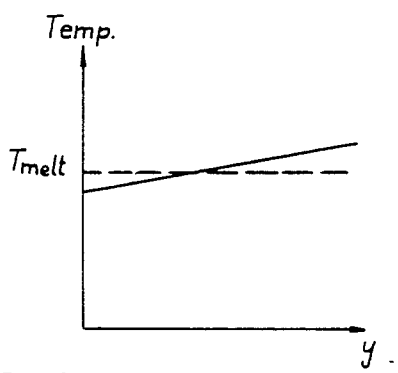
FIG. 3 is a plot of the temperature gradient in the region shown in FIG. 1 in a first direction at any given time during the resolidification of the region after it has been melted.
Figure 4:
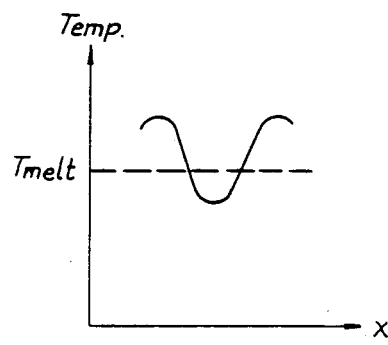
FIG. 4 is a plot of the temperature gradient in the region shown in FIG. 1 in a second direction at any given time during the resolidification of the region after it has been melted.

A seed comprising a single crystal of silicon is formed in the layer 104 of polysilicon by heating a region 106 of the layer 104 of polysilicon to above its melting point and then cooling the molten region under controlled conditions. Those conditions can be defined by establishing a coordinate system having "x" and "y" axes as shown in FIG. 1. To form a single-crystal seed the region 106 of polysilicon is heated to above the melting point of silicon, for example, to about 1410° C., and then cooled to establish the temperature gradients shown in FIGS. 3 and 4 at any particular time during cooling. "$T_{melt}$" indicates the melting point of silicon. At any given time the temperature gradient (in °C. per cm) across the solid-liquid interface in a given direction in the solidifying region should have a minimum value which depends on the solidification speed in that direction and the material. For example, for polysilicon, the temperature gradient in °C. per centimeter should be at least 5000 times the solidification speed in centimeters per second.

Figure 5:
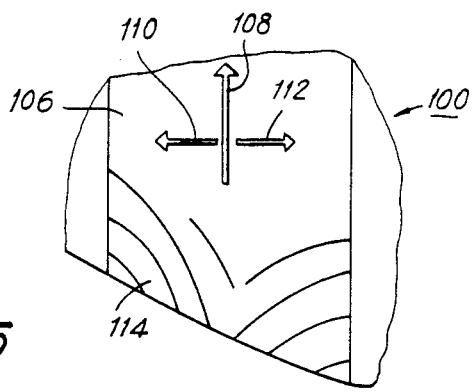
FIG. 5 shows the directions of resolidification of the molten region.

FIG. 5 illustrates how those temperature gradients create a single crystal from the molten region 106. As the region 106 cools, the molten silicon solidifies in the directions shown by the arrows 108, 110 and 112. Solidification of the region 106 proceeds along a first direction shown by the arrow 108 and outwardly toward the edges, as shown by the arrows 110 and 112, in a second direction normal to the first direction. This cooling pattern converts virtually the entire region 106 into a single crystal, with the exception of a small portion 114 at one end.

Figure 6:
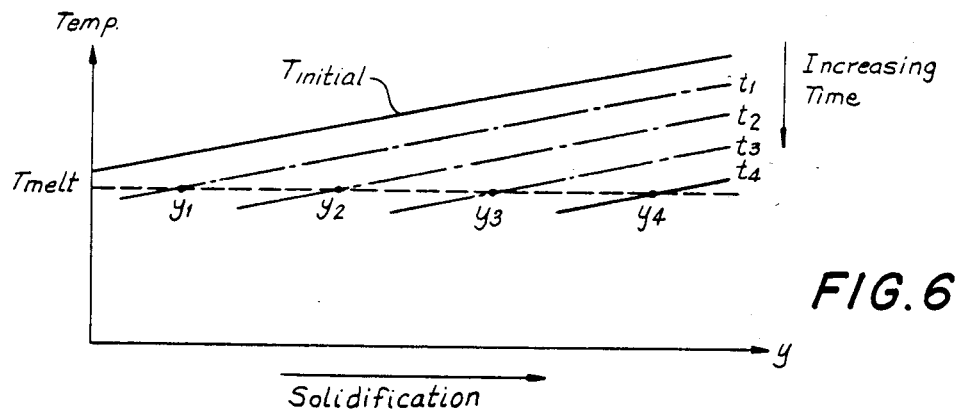
FIG. 6 illustrates one temperature gradient over time in the region shown in FIG. 1 in the first direction.
Figure 7:
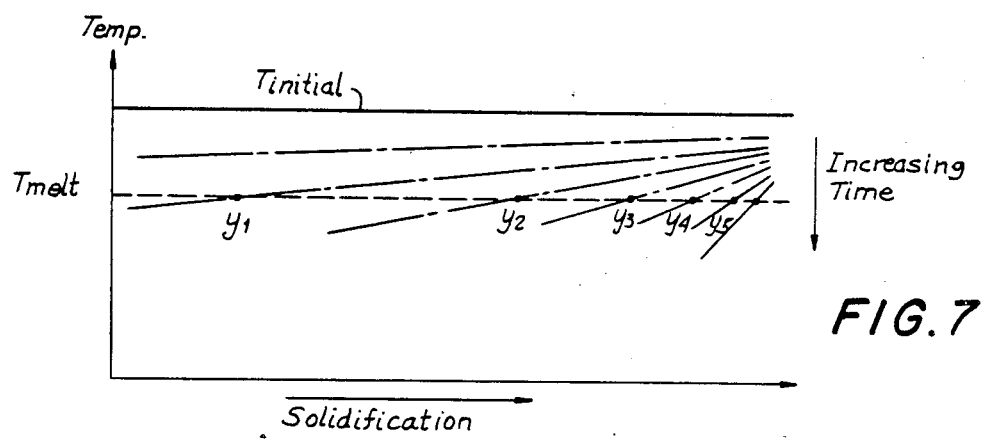
FIG. 7 illustrates another temperature gradient over time in the region shown in FIG. 1 in the first direction.

FIGS. 6–9 illustrate how that cooling pattern can be created. FIGS. 6 and 7 show the creation of a temperature distribution in the first direction (that is, in the y-direction as seen in FIG. 1).

In the embodiment illustrated in FIG. 6, the region 106 is initially heated so that it exhibits the increasing temperature gradient shown in FIG. 6. The region 106 then cools uniformly along its length (in the y-direction) and, as each location in the region 106 cools below the melting point of silicon, it solidifies. At time $t_1$, for example, the region 106 at $y_1$ solidifies; at time $t_2$, the region 106 at $y_2$ solidifies, and so on. Thus, the region 106 solidifies in the direction of the arrow 108 in FIG. 5.

Alternatively, the region 106 can initially be heated to a uniform temperature as shown in FIG. 7. In this embodiment the temperature distribution is established as the region 106 cools. The solidification direction is established by the non-uniform cooling pattern graphically illustrated in FIG. 7, in which the locations $y_1$, $y_2$, $y_3$, etc., solidify at times $t_1$, $t_2$, $t_3$, etc., respectively, similar to the embodiment shown in FIG. 6.

Figure 8:
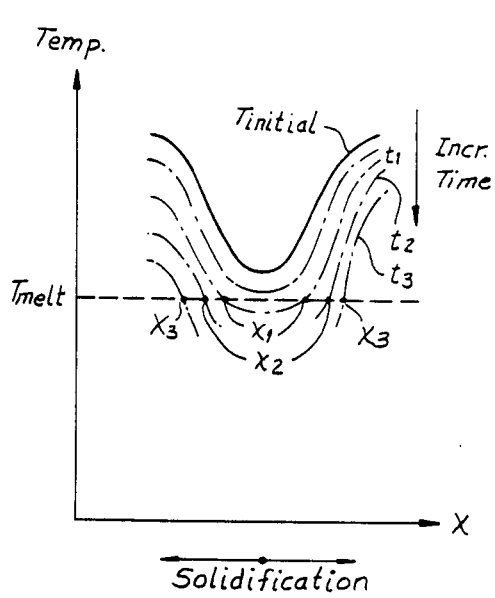
FIG. 8 illustrates one temperature gradient over time in the region shown in FIG. 1 in the second direction.
Figure 9:
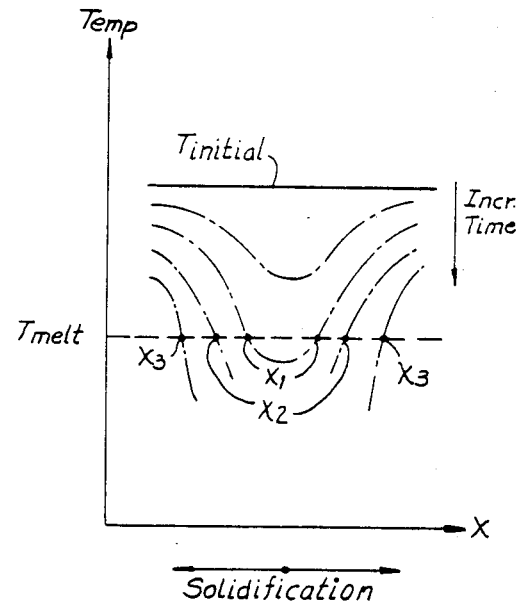
FIG. 9 illustrates another temperature gradient over time in the region shown in FIG. 1 in the second direction.

FIGS. 8 and 9 show how the proper temperature distribution can be established across the region 106 in the second direction (that is, along the x-axis). As shown in FIG. 8, the region 106 can be initially heated to establish the temperature gradient shown as $T_{initial}$. Then, as the zone 106 cools, the locations $x_1$, $x_2$ and $x_3$ solidify at times $t_1$, $t_2$ and $t_3$, respectively, Hence, the direction of solidification, as shown graphically in FIG. 8, is in the direction of the arrows 110 and 112 in FIG. 5.

Alternatively, the region 106 can be initially heated to a uniform temperature as shown in FIG. 9, and then cooled non-uniformly. In that case, solidification proceeds as is graphically shown in FIG. 9, which also corresponds to the direction of the arrows 110 and 112 in FIG. 5.

The creation of a molten region in the layer 104 requires the deposit of a large amount of energy in the layer. That can be accomplished by using the fine-line electron beam disclosed in co-pending U.S. patent application Ser. No. 455,266, filed Jan. 3, 1983, now U.S. Pat. No. 4,446,373, issued on May 1, 1980 as a continuation of patent application Ser. No. 224,313, now U.S. Pat. No. 4,382,186, U.S. Pat. No. 4,382,186 has been disclaimed in favor of U.S. Pat. No. 4,446,373, and assigned to the assignee of the present invention.

Figure 10:
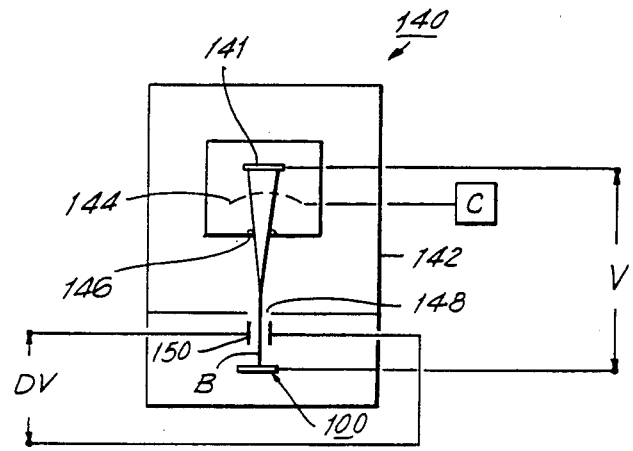
FIGS. 10 and 11 illustrate apparatus for providing a strip-like electon beam for melting the region shown in FIG. 1.
Figure 11:
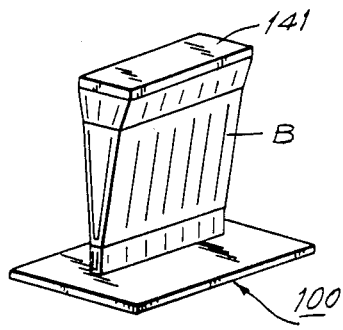

As disclosed in that application, such an electron beam can be generated using the apparatus 140 shown in FIGS. 10 and 11. The apparatus 140 creates a strip electron beam B that can deposit electrons with kinetic energies, power densities and energy densities having levels which melt a surface region of a workpiece, here the wafer 100, quickly enough to prevent heat conduction to the substrate underlying the surface region.

The apparatus 140 consists of a strip-like thermionic cathode 141 which is disposed in an evacuated housing 142 and is heated to release electrons. An extraction grid 144 controls the electrons and injects them to a focussing aperture 146. The electrons then pass through a ground aperture 148. A deflection system comprises electrostatic plates 150 across which a deflection voltage DV is applied. A potential difference V is maintained between the substrate 100 and the cathode 141 and a control system C can be provided to control the extraction grid voltage.

FIG. 11 shows schematically the shape of the electron beam B.

In this embodiment, the electron beam B momentarily impinges, for between 10 and 1000 microseconds, on the layer 104 initially to melt the entire region 106, which is then left to cool and solidify as described above in connection with FIGS. 6–9.

FIGS. 12–15 illustrate embodiments in which the region 106 is initially heated with the proper temperature gradient in the y- or first direction, as described above in connection with FIG. 6.

Figure 12:
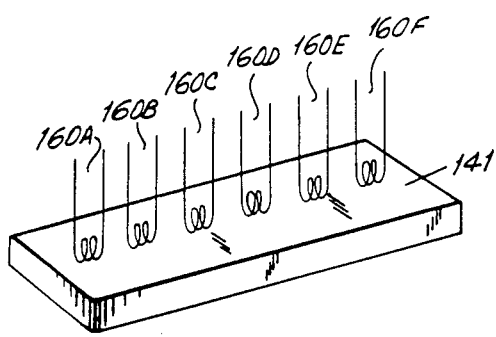
FIGS. 12–15 illustrate apparatus for providing the initial temperature gradient shown in FIG. 6.

In FIG. 12 the cathode 141 is heated non-uniformly along its length by a plurality of resistance heaters 160A, 160B, 160C, 160D, 160E and 160F. If the current supplied to each heater is slightly larger than that supplied to the immediately preceeding heater, then the current density of the beam B varies along the y-axis and the region 106 is heated non-uniformly along its length.

Figure 13:
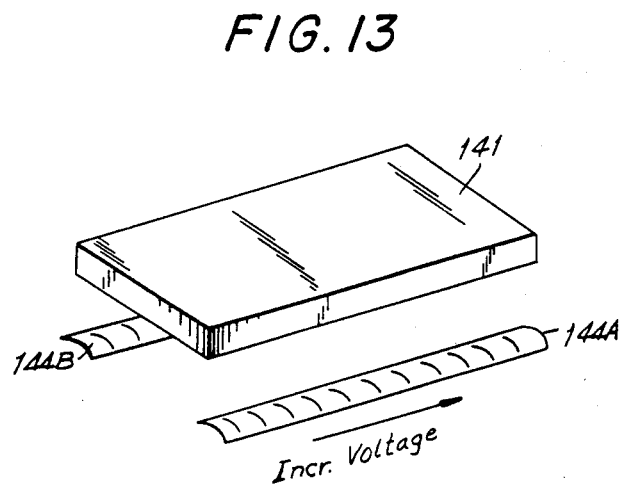

In FIG. 13 the cathode 141 is heated uniformly along its length, but the extraction grid elements 144A and 144B have applied thereto a potential gradient in the first direction. Thus the electron beam B has a higher current density at one end and heats the region 106 with the temperature gradient shown in FIG. 6.

Figure 14:
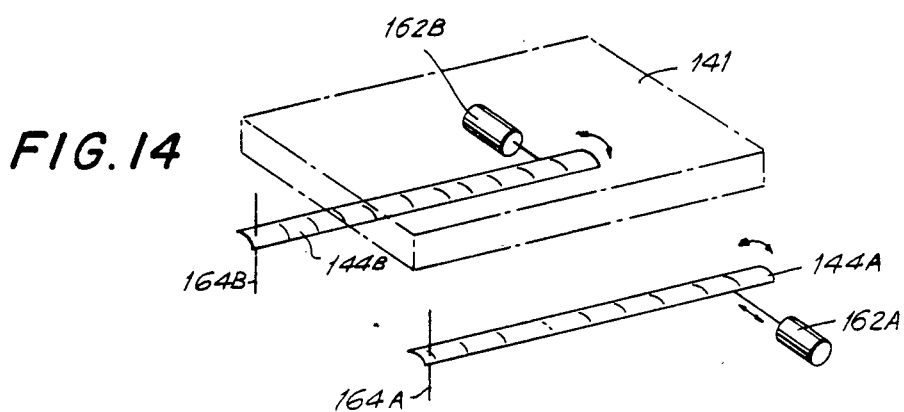

In FIG. 14 the cathode 141 is heated uniformly along its length and the extraction grid elements 144A and 144B have a uniform potential along their length. However, motors 162A and 162B are used to vary the distance between the elements 144A and 144B by rotating the elements about axes 164A and 164B, respectively. Again, the effect is to provide an initial temperature gradient like that in FIG. 6 in the region 106.

Figure 15:
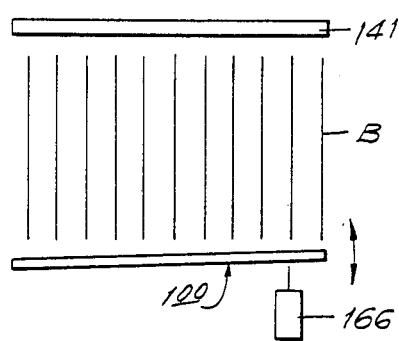

FIG. 15 shows another embodiment in which the cathode C is uniformly heated. A motor 166 is used to change the angular orientation of the wafer 100 relative to the cathode 141 to create the temperature gradient shown in FIG. 6.

FIGS. 16–21 illustrate embodiments by which the region 106 can be initially heated with the lateral temperature distribution in the x- or second direction described above in connection with FIG. 8.

Figure 16:
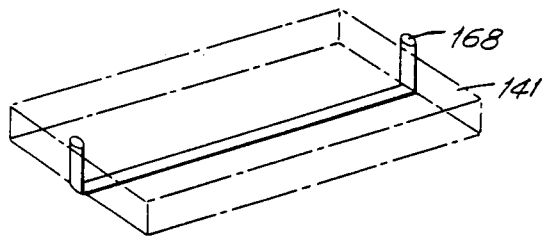
FIGS. 16–21 illustrate apparatus for providing the initial temperature gradient shown in FIG. 8.

In FIG. 16, a conductive element 168 is placed underneath the cathode 141 to extend along its length in the first direction. The element 168 is midway between the edges of the cathode 141 in the second direction. The potential of the element 168 relative to the wafer 100 is less than the potential of the cathode 141 so that the current density of the beam B increases from the center to the edges and creates the temperature gradient shown in FIG. 8.

Figure 17:

FIG. 17 shows an arrangement using two cathodes 141$_1$ and 141$_2$. By providing an angle A between the cathodes, the current density of the beam B can be controlled to provide the temperature gradient shown in FIG. 8.

Figure 18:
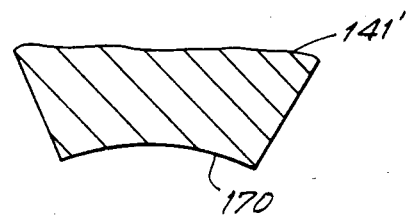

FIG. 18 shows a modified cathode 141'. The cathode 141' has a curved emitting surface 170 which creates a beam B having a current density at the substrate that creates a temperature gradient like that shown in FIG. 8.

Figure 19:
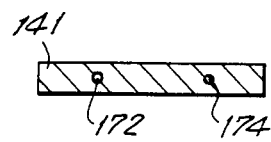

FIG. 19 shows the cathode 141 heated internally by two filaments 172 and 174. The use of two spaced-apart filaments creates a current density gradient in the electron beam B which creates a temperature distribution in the region 106 like that shown in FIG. 8.

Figure 20:
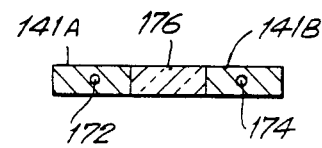

FIG. 20 shows a slight modification of the embodiment shown in FIG. 19. The cathode 141 in this embodiment comprises two cathode elements 141A and 141B which have the filaments 172 and 174 embedded therein, respectively. The cathode elements 141A and 141B are separated by an insulating member 176. When the filaments 172 and 174 are heated by the passage of current therethrough, the cathode elements 141A and 141B create a beam B the current density of which at the wafer surface establishes the temperature distribution shown in FIG. 8.

Figure 21:
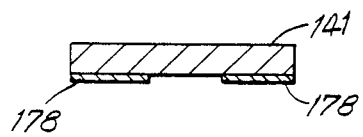

In the embodiment of FIG. 21, the cathode 141 is coated with two areas 178 of material, for example, Ba$_2$O with cesium, having a higher emissivity of electrons than the material of the cathode 141. When the cathode 141 is heated the areas 178 emit more electrons and create the temperature distribution shown in FIG. 8.

Of course, to create both temperature gradients shown in FIGS. 6 and 8, any of the embodiments in FIGS. 12–15 can be combined with any of the embodiments in FIGS. 16–21. For example, the cathode shown in FIG. 21 could be heated along its length as shown in FIG. 12 to create the longitudinal and lateral temperature gradients shown in FIGS. 6 and 8, respectively.

It is also possible initially to create a uniform temperature in the region 106 and control the manner in which it cools non-uniformly to provide solidification in the proper directions as described above in connection with FIGS. 7 and 9.

FIGS. 22–24 illustrate a wafer provided with a structure that creates the temperature gradient over time shown in FIG. 7 as the region 106 cools. The substrate 102 includes a thermal layer 200 on which is provided the region 106 of polysilicon. The thermal layer 200 provides different rates of heat conduction in different areas thereof. The thermal layer 200 comprises a first layer 202 of a good heat conductor such as polysilicon deposited by any well-known method such as CVD. On top of the first layer 202 a second layer 203 of a heat-insulating material such as SiO$_2$ is formed by CVD. The second layer 203 is masked and etched by well-known techniques to form a fence 204 that defines the region 106. At one end of the region 106 a portion 206 of the second layer 203 is etched to a slightly greater depth than the remainder of the region 106. Polysilicon is then deposited in the region 106 bounded by the fence 204.

When the substrate 102 shown in FIGS. 22–24 is subjected to the electron beam, it is initially heated throughout, say to an even temperature as shown in FIG. 7. However, as it cools the portion 206 forms a heat sink because of the reduced thickness of the second layer of heat-insulating material 203. Furthermore, the fence 204 retards heat flow from the molten polysilicon in the region 106 in directions other than through the portion 206. Thus, the region 106 cools as shown in FIG. 7 and solidifies in the direction of the arrow 108 shown in FIG. 5.

In an alternate embodiment, the second layer 203 is changed slightly as shown in FIG. 25. In this embodiment, the thickness of the layer 203A gradually increases from one end of the region 106 to the other. When the region 106 of polysilicon is exposed to a uniform electron beam, it melts and then solidifies again as shown in FIGS. 5 and 7.

In still another embodiment, as shown in FIG. 26, the second layer 203 is substantially as shown in FIG. 24. However, the effect of the heat sink action of the portion 206 is enhanced by providing a heat-conducting radiator 210 in contact with the polysilicon in the region 206. The radiator 210 conducts heat from the end of the zone 208 and radiates it into the ambient surroundings to enhance the cooling pattern provided by the wafer shown in FIG. 24.

Figure 27:
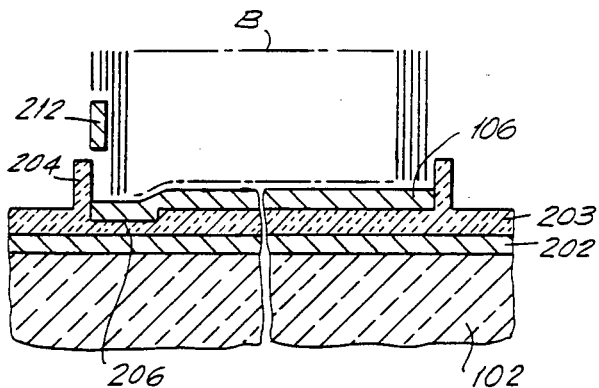

It is also possible to enhance the cooling pattern described in connection with FIG. 7 by preventing exposure of certain parts of the zone to the electron beam B. As shown in FIG. 27, a substrate 102 is provided with the layers 202 and 203 substantially as shown in FIG. 24. A mask 212 is disposed above the heat sink formed by the reduced-thickness portion 206 to prevent the extreme end of the region 106 from being exposed to the electron beam B. Thus, a relatively cooler region is provided which enhances the heat flow and provides the cooling pattern illustrated in FIG. 7.

Figure 28:
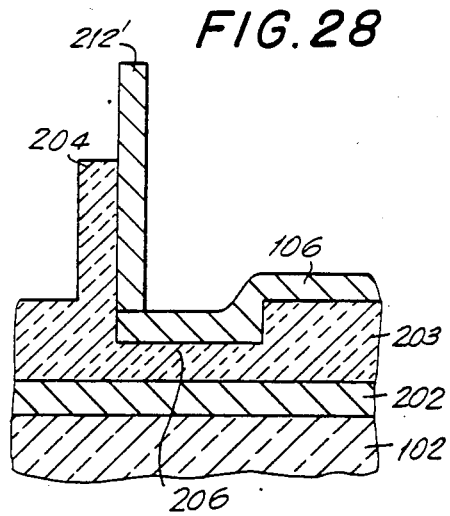

FIG. 28 shows a slight modification of the embodiment shown in FIG. 27, in which a mask is also used as a radiator, similar to the radiator 210 shown in FIG. 26. In FIG. 28 the radiator 212' masks some of the polysilicon in the region 106 from exposure to electrons. In addition, because it is in contact with the polysilicon in the region 106, it also acts as a radiator further to enhance the required cooling pattern.

Figure 29:
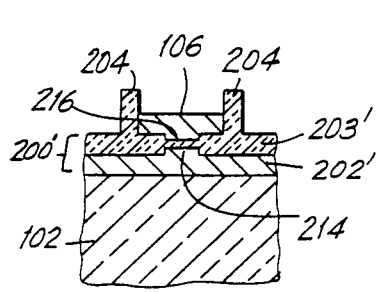
FIGS. 29–31 illustrate wafer constructions for providing the temperature-time relationship shown in FIG. 9.
Figure 30:
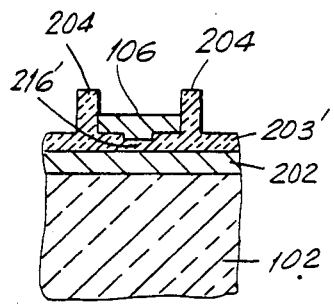
Figure 31:
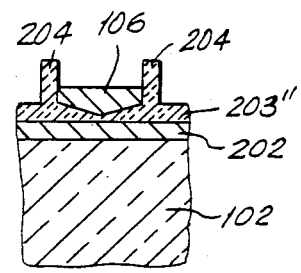

It is also possible to construct a wafer that controls the manner in which the region cools laterally (in the second or x-direction) as described above in connection with FIG. 9. FIGS. 29-31 describe in detail such a wafer construction.

In FIG. 29 the substrate 102 includes a thermal layer 200' deposited on the base of the substrate and comprising a first layer 202' of a heat-conducting material and a second layer 203' of a heat-insulating material. As described above in connection with FIGS. 24-26, the layer 202' will typically consist of polysilicon. After deposition, that layer is etched to form a small ridge 214 running in the y-direction as shown in FIG. 29. On top of the first layer 202' of polysilicon, the second layer 203' of heat-insulating material, such as SiO$_2$, is formed and then etched to provide the cross-section shown in FIG. 29. More particularly, the second layer 203' is etched to provide the fence 204 around the region 106 and a central portion 216 overlying the ridge 214 and having a reduced thickness. The layer of polysilicon which will form the seed crystal is deposited in the region 106. The substrate 102 is then subjected to a uniform electron beam which heats it above its melting point. As the molten polysilicon in the region 106 cools, a temperature gradient is established as described in connection with FIG. 9, so that the direction of solification proceeds as shown in FIG. 5. The reduced thickness portion of the layer 203' in the middle of the region 106 acts as a heat sink to establish the proper temperature gradient in the cooling polysilicon.

In FIG. 30, a slightly altered embodiment of the configuration shown in FIG. 29 is illustrated. In constructing the wafer shown in FIG. 30, the step of etching the first layer 202' of polysilicon is omitted. Thus, a uniform layer 202 of polysilicon, like that shown in FIGS. 24-26, is disposed on the substrate 102 beneath the etched layer 203' of SiO$_2$. When the region 106 of polysilicon is melted by the uniform electron beam, the reduced thickness area 216' in the center of the region 106 acts as a heat sink, like that described in connection with FIG. 29.

In FIG. 31 another embodiment is shown. The substrate 102 and the first layer 202 are substantially identical to those described in connection with FIG. 30. However, the layer of insulating material is etched to provide a second layer 203" with the cross-section shown in FIG. 31. Thus, when the region 106 is subjected to a uniform electrical beam, and initially heated as shown in FIG. 9, it will cool and solidify as shown in FIG. 5.

Figure 32:
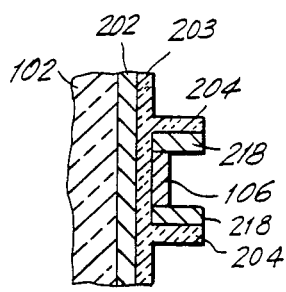
FIGS. 32–33 illustrate an alternate embodiment of the wafer constructions shown in FIGS. 22–31.
Figure 33:
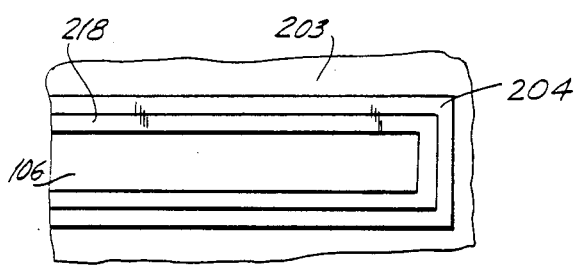

FIGS. 32 and 33 show another embodiment for establishing the cooling patterns shown in FIG. 5. A substrate 102 is provided with the thermal layer 200 (not identified by reference numeral in FIGS. 32 and 33); comprising a first layer 202 of polysilicon and a second layer 203 of SiO$_2$ substantially as has already been described. Within the fence 204 a heating member 218, made of a material which absorbs electrons and is heated thereby, surrounds the periphery of the region 106. This member 218 typically is made of a material with properties such that the parameter $k\rho C$ (where $k$ = thermal conductivity in watts/cm-°C., $\rho$ = density in g/cm$^3$ and C = specific heat in Joules/g-°C.), is relatively low, say below 1.0, which is the value of $k\rho C$ for silicon. A typical example of such a material is titanium, which has a value of $k\rho C$ = 0.2. Qualitatively, the parameter $k\rho C$ can be regarded as a measure of how readily a material will heat when exposed to energy, with materials which heat more readily exhibiting smaller values for $k\rho C$. When the region 106 is subjected to the electron beam, the heating member 218 is heated and the heat thereof is retained because of the insulating characteristics of the fence 204. Thus, the cooling pattern shown in FIG. 5 is further enhanced.

Thus, a single crystal can be formed on a relatively inexpensive substrate material. Those skilled in the art will recognize that the embodiments thus far disclosed can be used in almost any combination to provide the solidification pattern shown in FIG. 5. For example, an electron beam which creates an initial temperature gradient can be used with a wafer configuration which enhances solidification in the necessary directions, or the wafer construction can be used to create a cooling pattern in one direction while the apparatus used to provide the electron beam alone creates the necessary cooling pattern in the other direction.

The single crystal thus is particularly adapted to be used as a seed for making a large, single-crystal semiconductor device by scanning with the strip-like electron beam B as shown in U.S. patent application Ser. No. 492,800, filed May 9, 1983, and assigned to the assignee of the present invention. Thus, it is particularly convenient to use the same type of electron beam to melt the region 106, which results in an elongated rectangular seed, as shown herein. However, those skilled in the art will recognize that other seed-crystal shapes are possible.

After a seed has been formed, the same or a similar electron beam is used to scan the wafer to form a large, single-crystal semiconductor device in accordance with the disclosure in the aforementioned patent application. In particular, FIG. 34 shows schematically the use of the electron beam B to scan the surface of the wafer 100. The beam B begins at a location such that it melts some but not all of the single-crystal seed in the region 106 and then is moved relative to the wafer 100 to create a molten zone in a polysilicon layer on the substrate which grows into a single crystal from the seed. As shown in FIG. 34, the portion 114 of the seed is not usable and generally is etched off the substrate before it is scanned by the electron beam to create the semiconductor device.

FIGS. 35–38 illustrate in detail how the seed can be used to create a large, single-crystal semiconductor device.

FIG. 35 shows a wafer 100 having a cross-section similar to that shown FIG. 30. The layer 220 of polysilicon which is used to form the seed is generally deposited over the entire surface of the subtrate prior to creating the seed, a detail which was omitted from the description above for the sake of clarity. That approach saves the manufacturing expense and time which would be required to mask those areas of the surface of the substrate which were not going to be used to form the seed. In any case, FIG. 35 shows the wafer 100 after the seed has been formed in the region 106.

FIG. 36 shows a chemical-resist mask 300 which is deposited over the surface of the wafer and then etched to expose one side of the fence 204 and the portion of the layer 220 of the polysilicon which was not formed into the seed by the electron beam B. In FIG. 37, the wafer 100 is shown after the layer 220 of polysilicon and one side of the fence 204 has been removed by etching and after the chemical-resist mask 300 has been removed. An operating layer of polysilicon 302 is then deposited partially on the seed as shown in FIG. 38 by conventional techniques. The wafer 100 in FIG. 38 can then be scanned by the electron beam B as illustrated in FIG. 34 to form a large single-crystal semiconductor device by lateral epitaxial recrystallization of the operating layer.

FIG. 39 illustrates a wafer configuration that enhances the tendency of the molten polysilicon, created when the layer 302 is scanned by the electron beam B, to solidify in the proper direction.

As discussed in patent application Ser. No. 492,800, the direction of solidification of the molten polysilicon must be controlled if a good quality, single-crystal layer is to be provided. Specifically, solidification should proceed in the same direction for the entire region in which the single crystal is to be provided. The construction shown in FIGS. 35–38 conveniently provides for enhancing the tendency of the polysilicon to solidify in the same direction because of the heat sink provided to form the crystal. By using the same techniques in forming the large single-crystal device that were used in forming the seed, that tendency can be further enhanced.

As shown in FIG. 39, the wafer 100 shown in FIG. 38 can be prepared with a fence 204 of $SiO_2$ around the layer 302 of polysilicon that will form the single crystal when scanned by the electron beam B. (Depiction of the edges of the seed S and the layer 302, which are shown in FIG. 38, has been omitted from FIG. 39 for clarity.) The reduced thickness portion 216' will thus provide a heat sink while the fence 204' retards heat flow from the remainder of the region.

Those skilled in the art will recognize that any of the configurations shown in FIGS. 29–31 will provide a heat sink when the layer 302 of polysilicon is scanned to produce a large single-crystal. In addition, the use of a heating member like that shown in FIGS. 32–33 can also be used to provide the desired direction of heat flow in the molten polysilicon area.

Those skilled in the art will realize that it might be desirable to provide more than one seeding location in the path of the electron beam B as it scans the wafer surface. It will be readily recognized that it is possible to provide as many such seeds across the wafer surface as are deemed necessary and provide them with the proper spacing as well. For example, the cross-section shown in FIGS. 29–31 can be repeated as many times as are desired on the surface of the substrate to provide multiple seeding locations on the wafer shown in FIGS. 34–38.

Thus a large, single-crystal semiconductor device can be provided on a relatively inexpensive substrate material because the substrate is not the source of the seed, as in the technique described in patent application Ser. No. 492,800. In addition, because the depth of the molten zone can be precisely controlled using the electron beam disclosed herein, it is possible to create a seed in only the upper portion of the polysilicon layer on the substrate and then also to form a single crystal in only an upper portion of the polysilicon layer. Using that technique, a single-crystal device can be created directly on top of a layer of polysilicon.

Figure 40:
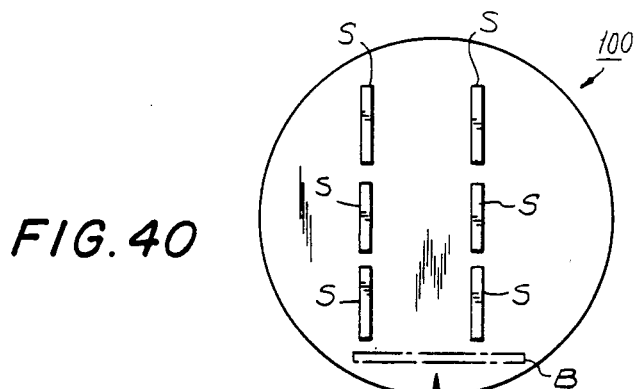
FIG. 40 is a top view of a wafer like that shown in FIG. 1 with a plurality of seeds formed thereon.

FIG. 40 illustrates the use of the electron beam B to scan a substrate to form a plurality of seeds S. For example, assume that the wafer 100 was provided with a plurality of regions 106 having the cross-section shown in either FIG. 29, 30 or 31. The electron beam B is then used to scan the wafer as shown in FIG. 40. The proper direction of solidification in the first direction is established by the scanning beam as discussed in patent application Ser. No. 492,800. The temperature distribution in the second direction, across the region 106, is established as discussed above in connection with FIGS. 29–31. Thus, a plurality of seeds S can be formed in one continuous process.

Figure 41:
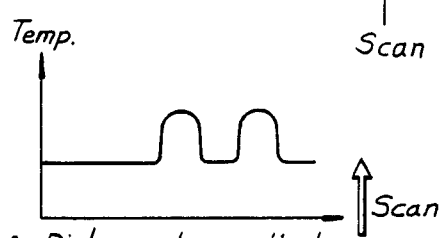
FIG. 41 illustrates a possible temperature profile in the polycrystalline layer of a wafer like that shown in FIG. 1.
Figure 42:
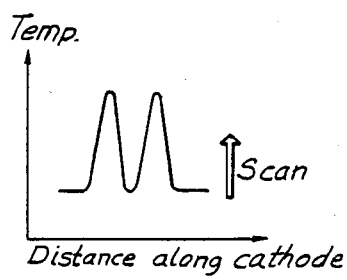
FIG. 42 illustrates another possible temperature profile in the polycrystalline layer of a wafer like that shown in FIG. 1.
Figure 43:
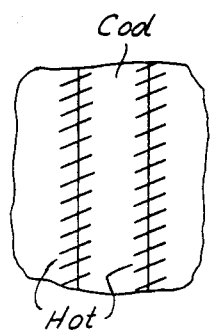
FIG. 43 is a top view of part of a wafer like that shown in FIG. 1 showing the temperature distribution created in the seed region by the embodiments shown in FIGS. 41–42.

In a variation on this embodiment, shown in FIGS. 41 and 42, the electron beam intensity is varied along the length or width of the cathode, respectively. The wafer 100 with a single uniform layer of polysilicon, as shown in FIG. 2 for example, is scanned using such an electron beam B. A plurality of alternating hot and cool zones are formed on the surface of the substrate as shown in FIG. 43. The resulting solidification pattern corresponds to that shown in FIG. 5 and thus a plurality of seeds can be formed without using the various configurations of fences, heat sinks and masks discussed above. Of course the temperature profile shown in FIG. 41 can be repeated many times across the length of the cathode to form a plurality of seeds as the beam scans the wafer. In addition, by turning the beam on and off, a pattern of seeds like that shown in FIG. 40 can be created.

Those skilled in the art will recognize from FIGS. 10–21 how to construct apparatus for providing an electron beam for providing the temperature pattern shown in FIGS. 41 and 42. For example, the electron beam depicted in FIG. 42 can be provided by any of the configurations discussed above and shown in FIGS. 16–21.

Figure 44:
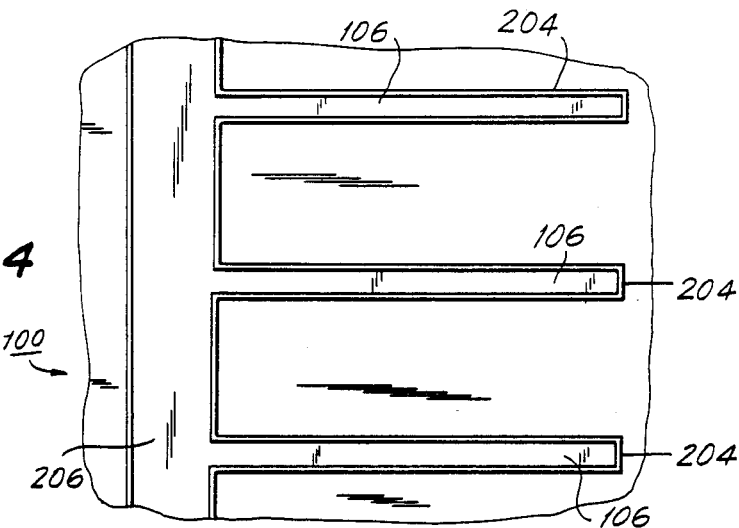
FIG. 44 is a top view of an alternate wafer construction for making a plurality of single-crystal seeds.

FIG. 44 illustrates in particular how the general principles thus described can be used to form seeds having any desired configuration. As shown in FIG. 43, the wafer 100 has a thermal layer with a cross-section similar to that shown in FIG. 24, for example. A plurality of regions 106 are provided adjacent to and spaced from each other and a common heat sink is provided in the area 206 having a reduced thickness insulating layer. As the electron beam B scans the wafer, a seed is formed in each region 106. The long dimensions of the beam moves normal to the regions 106 for forming the seeds and, to produce the final device, the beam scans the wafer with its long dimension parallel to the seeds formed in the regions 106.

The formation of the seeds can be enhanced by not turning on the electron beam until part of the region 206 has been traversed, which will make the region 206 even cooler and promote heat flow in the proper direction.

The advantages of the present invention will be apparent to those skilled in the art. A large, single-crystal semiconductor device or a plurality of such devices having almost any desired configuration can be easily and quickly made on virtually any substrate material. The expense both in terms of material costs and yields of large, single-crystal semiconductor devices can be significantly increased by using the present invention.

The present invention has been described by referring to many particular embodiments. However, those skilled in the art will recognize that numerous modifications other than those specifically pointed out can be made without departing from the spirit of the invention. For that reason, the scope of present invention is limited and defined solely by the following claims.

What is claimed is:

1. A method of making a large, single-crystal semiconductor article, comprising the steps of:
   providing a wafer including a substrate having thereon a seed layer of polycrystalline or amorphous material;
   exposing a region of said seed layer to a beam of electrons to melt said region;
   solidifying said molten region from one end of said region in a first direction and outwardly toward the edges of said region in a second direction substantially normal to said first direction for forming a seed comprising substantially a single crystal in said region; and
   scanning an operating layer of polycrystalline or amorphous material on said substrate in contact with said seed with a beam of electrons having a strip-like configuration by moving said wafer and said beam relative to each other in said second direction to remelt a portion of said seed and to create a molten zone in said operating layer that recrystallizes substantially as a single crystal by lateral epitaxial recrystallization from said seed.

2. A method as in claim 1; comprising the step of providing a substrate base and a thermal layer on said substrate base including a heat-insulating layer underlying said region and forming a fence enclosing said region and further comprising the steps of:
   removing from one side of said region said fence extending in said first direction after said seed is formed; and
   providing said operating layer as a substantially continuous layer of polycrystalline or amorphous material in contact with said one side of said region.

3. A method as in claim 2; wherein said seed layer substantially covers said substrate, the method further comprising the steps of:
   depositing a mask on said seed and leaving exposed the remainder of said seed layer and one side of said fence;
   removing said remainder of said seed layer and said one side of said fence by etching;
   removing said mask; and
   depositing said operating layer partially over said seed and extending therefrom in said second direction.

4. A method as in claim 3; further comprising removing a polycrystalline portion of the solidified region of said seed layer after formation of said seed.

5. A method as in claim 1; wherein said seed layer and said operating layer are polysilicon.

6. A method as in claim 1; wherein said seed layer has a first thickness and said molten region has a depth less than said first thickness and said operating layer has a second thickness and said molten zone has a depth less than said second thickness.

7. A method as in claim 1; wherein said exposing step includes exposing a plurality of regions of said seed layer to said beam to form a plurality of said seeds in said seed layer.

8. A method as in claim 1; wherein said seeds are rectangular with the longer side thereof in said first direction and are spaced apart in said second direction with said operating layer therebetween and said scanning is effected by moving a rectangular beam of electrons relative to said wafer with the longer side of the beam parallel to the longer side of said seeds.

* * * * *